United States Patent [19]

Gregory et al.

[11] 3,866,064

[45] Feb. 11, 1975

[54] CMOS ANALOG SWITCH

[75] Inventors: Charles Roy Gregory, Melbourne; William Harold White, Indialantic, both of Fla.

[73] Assignee: Harris-Intertype Corporation, Cleveland, Ohio

[22] Filed: Aug. 22, 1973

[21] Appl. No.: 390,499

[52] U.S. Cl. .................................. 307/251, 307/304
[51] Int. Cl. .......................................... H03k 17/00
[58] Field of Search ......... 307/251, 304; 317/235 G

[56] References Cited

UNITED STATES PATENTS

| | | | |
|---|---|---|---|
| 3,408,511 | 10/1968 | Bergersen et al. | 307/304 |
| 3,457,435 | 7/1969 | Burns et al. | 307/251 |
| 3,708,694 | 1/1973 | Evans | 307/251 |
| 3,720,848 | 3/1973 | Schmidt, Jr. | 307/251 |
| 3,789,244 | 1/1974 | Provanzano | 307/304 |

*Primary Examiner*—Stanley D. Miller, Jr.
*Attorney, Agent, or Firm*—Fidelman, Wolffe & Leitner

[57] ABSTRACT

A complementary metal oxide semiconductor switch interconnected such that body voltages of both the P channel and N channel MOS devices are limited to one forward diode drop of their source and drain voltages, and results in a uniform threshold voltage and low uniform switch "on" resistance.

10 Claims, 1 Drawing Figure

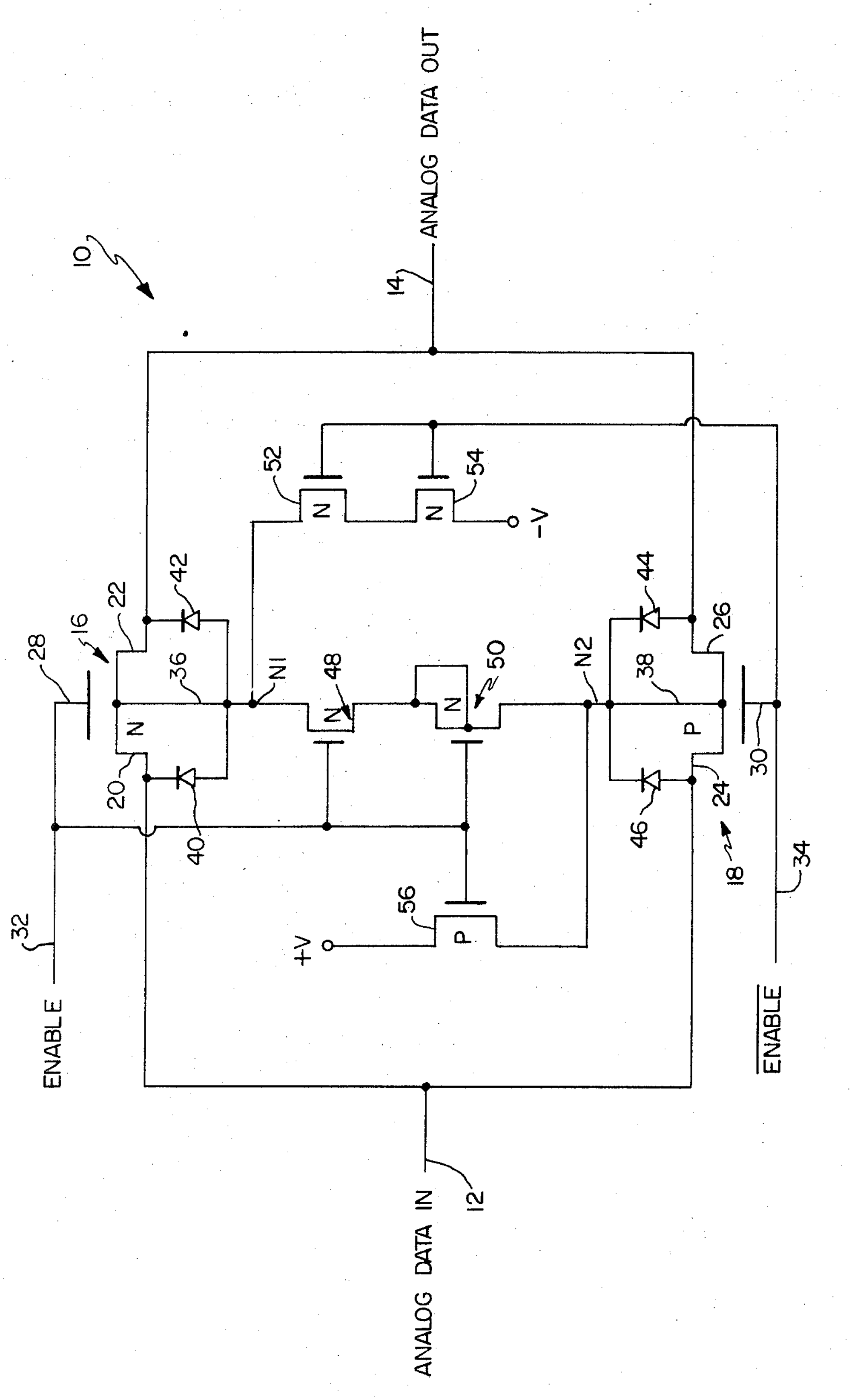
ANALOG DATA OUT
ANALOG DATA IN
ENABLE
ENABLE
+V
-V
N1
N2
N
P

CMOS ANALOG SWITCH

BACKGROUND OF THE INVENTION

1. Field of the Invention

The present invention relates generally to complementary metal oxide semiconductors (C-MOS) devices and more particularly to the use of C-MOS devices as analog switches.

2. Description of the Prior Art

The C-MOS analog switches are used as solid state switch relays in analog and digital multiplexing and demultiplexing circuits, as well as other digital and analog information transmission systems. These switches are known for their switching speed and their high "off" resistance.

Since C-MOS devices are used to transmit information, they must transmit such information through the switch unaltered. A major problem with the present type of solid state switches is that the input to output resistance varies non-linearly with the input voltage. The non-linearity of the resistance across the MOS device is due to a variation in threshold voltage which is a function of the source-to-body bias effect. The variation of the gating threshold voltage for the MOS's device results in a non-linear resistance across the device which varies with the input voltage and thus causes distortion of the input signal.

The accuracy of transmission of the solid state relay is very critical and the information carried thereto in the form of a voltage level must be transmitted with a minimum of distortion.

The majority of the C-MOS analog switches in the prior art have been fabricated using junction isolation. Since a plurality of C-MOS devices have a common substrate in the junction isolated fabrication technique, all of the bodies of the P channel devices are tied to the most positive potential available to the circuit, and the N channel devices' bodies are tied to the most negative potential available to the circuit. Thus, the individual body voltages cannot be controlled separately but must be treated in common.

Various techniques have been used in the prior art to maintain a constant voltage relationship between the body and the source of the C-MOS devices in junction isolated circuits. These techniques have involved intricate sensing and feedback devices which sense the voltage relationship between the body and the source and using feedback tries to maintain the voltage with a selected given region. This technique results in a system which is uneconomical, cumbersome, and inefficiently designed and poorly controlled.

SUMMARY OF THE INVENTION

The present invention is a C-MOS analog switch having a series of solid state switches to limit the maximum voltage between the sources and the bodies of the P channel and N channel MOS devices within one forward diode drop. The diodes between the bodies and the source or the drain are inherently present in the dielectrically isolated metal oxide semiconductor devices. The additional switching semiconductive devices maintain the bodies of the P and N channel MOS devices at the positive-most voltage and the negative-most voltage available to the circuit, respectively, when they are not conducting and interconnect the bodies of the complementary MOS devices when the analog switch is conducting. Thus, when the switch is inhibited or non-conducting, the P and N channel devices are reverse biased and will not conduct. When the analog switching device is enabled or conducting, the maximum and mimimum voltage available is removed from the bodies of the complementary pair and their source-to-body voltage is allowed to increase to the maximum value which is one forward diode drop of the inherent source-to-body diode. Thus, a uniform threshold voltage and low uniform switch "on" resistance is produced.

OBJECTS OF THE INVENTION

An object of the present invention is to provide a complementary metal oxide semiconductor switch having a uniform threshold voltage.

Another object of the invention is to provide a complementary metal oxide semiconductor switch having uniform "on" resistance.

A further object is to provide a complementary metal oxide semiconductor switch having uniform threshold voltage by limiting the body-to-source voltage to within one forward diode drop.

Still another object of the present invention is to provide a complementary metal oxide semiconductor switch formed in dielectrically isolated regions which are reverse biased to prevent accidental operation when inhibited and which have a uniform threshold voltage and "on" resistance when enabled.

BRIEF DESCRIPTION OF THE DRAWINGS

The FIGURE is a schematic diagram of the subject C-MOS analog switch.

DESCRIPTION OF THE PREFERRED EMBODIMENTS

The FIGURE shows the C-MOS analog switch 10 as having complementary metal oxide semiconductor devices connected in parallel between analog data input 12 and analog data output 14. The complementary pair of metal oxide semiconductor field effect transistors 16 and 18 are N and P channel-type, respectively, having their source and drains (20, 22, 24, 26) connected in parallel between the analog input 12 and analog output 14. Gate 28 of MOS device 16 is connected to control input 32 and gate 30 of MOS device 18 is connected to control input 34 which is the inverse of the signal applied to control input 32. The bodies, 36 and 38 of MOS device 16 and 18 are connected to nodes $N_1$ and $N_2$, respectively.

Diodes 40, 42, 44 and 46 connect the source and drain of the N and P channel MOS device to the bodies 36 and 38, respectively. The diodes are the body-source and body-drain diodes inherent in MOS devices and are not added.

Connected in series between nodes N1 and N2 are N channel MOS devices 48 and 50. The source of N channel MOS device 50 is connected to the body thereof. The gates of N channel MOS devices 48 and 50 are connected to control input 32. Connected in series between node N1 and a negative voltage source −V are N channel MOS devices 52 and 54, whose gates are connected to input 34. P channel MOS device 56 is connected in series between node N2 and a positive voltage source +V and has its gate connected to control input 32.

Switch 10 operates as follows: When the analog switch 10 is off, whereby control input 32 is low and consequently the inverse control input 34 is high, MOS device 16, 18, 48 and 50 are biased off and MOS device 52, 54 and 56 are gated on. The conduction of MOS device 52, 54 places node N1 at essentially −V and the conduction of MOS device 56 places node N2 at approximately +V. If, for example, the analog input signal is to vary between ± 10 volts and the voltages +V and −V are ±12 volts, respectively, the bodies 36 and 38 of MOS devices 16 and 18 are at least 2 volts back biased with respect to their sources. These 2 volts back bias prevents accidental voltage transmittal of the analog signal through MOS devices 16 and 18.

When analog switch 10 is turned on or enabled, that is, when control input 32 is high and inverse control input 34 is low, MOS devices 16, 18, 48 and 50 are gated on and 52, 54 and 56 are biased off. The conduction of MOS devices 48 and 50 ties the nodes N1 and N2 together and the non-conduction of devices 52, 54 and 56 remove voltages −V and +V, respectively, from nodes N1 and N2 and consequently the bodies 36 and 38 of MOS devices 16 and 18, respectively.

The purpose of analog switch 10 is to reach a stable state where the output is at the same voltage as the input. If during a transient state, the analog output were negative with respect to the analog input, there would be three current paths established. One path would be through N channel device 16, the second path would be through P channel device 18, and the third path would be established through diodes 46, MOS devices 50 and 48 and diode 42. In order for the current to flow through the third path, node N1 would have to be one forward diode drop above the analog output voltage and the analog input voltage would have to be one forward diode drop above node N2, assuming negligible voltage drops across MOS devices 48 and 50. Thus, during a transient state, when the analog output voltage is changing to the analog input voltage, the body 36 of N channel device 16 would be one forward diode drop above its source 22 and the body 38 of P channel device 18 would be one forward diode drop below its source 24 since the source of the P channel device 18 is the signal input and the source of the N channel device 14 is the output.

As the stable or DC state is established, that is, when the analog output signal equals the analog input signal, nodes N1 and N2 would remain (for all purposes) equal to the output voltage and input voltage, respectively, which would be equal.

Similarly, if the output analog voltage were positive with respect to the analog input voltage during the transient state, the current paths would be through both MOS devices 16 and 18 and a third path from the analog output 14 through diode 44 and MOS devices 50 and 48 and diode 40 to analog input 12. In this transient state, the bodies of MOS devices 16 and 18 are also one forward diode drop from their sources since the source of the P channel device 18 would be the analog output and the source of the N channel device 14 would be the analog input.

It is evident from the above description of the operation analog switch 10 that during the transient states, that is, when the analog input is not equal to the analog output, the bodies of the complementary MOS devices 14 and 16 (which are connected in parallel between the analog input and output) are limited to one forward diode drop of the sources and drains of their respective MOS devices.

How does the clamping or limiting of the body to source voltage result in uniform threshold voltage and low uniform switch "on" resistance (RON) In an MOS device, the "on" resistance is defined by the following equation:

$$RON = 1/[2(V_{GS}-V_T) - V_{DS}]\ K'(W/l)$$

$$\text{as } VDS \rightarrow O;\ RON = 1/2(V_{GS}-V_T)K'(W/l)$$

where $V_{GS}$ = Gate to source voltage
$V_T$ = Threshold voltage
$K'$ = Conduction factor
$W$ = Width of device
$l$ = Length of device
$V_{DS}$ = Drain to source voltage In the above equations, the conduction factor K', is process dependent. The gate to source voltage ($V_{GS}$), the drain to source voltage, ($V_{DS}$), width and length are a function of the circuit design in use. The threshold voltage ($V_T$) is a function of many factors, however, and it can be broken down into the sum of two terms:

$$V_T = V_{TO} \pm K_1 \left( \sqrt{2\ \phi_f \pm V_{BG}} - \sqrt{2\phi_f} \right)$$

where $V_{TO}$ = threshold voltage for $V_{BG} = 0$
$\phi_f$ = Ferni potential of bulk silicon
$V_{BG}$ = Body to source voltage
$K_1$ = Back gate constant + for NCH, − for PCH $$K_1 = \text{tox/Eox} \quad \sqrt{2q\ E_s N}$$

where

Tox = oxide thickness
Eox = Gate dielectric constant
$q$ = charge of electron
$E_s$ = silicon dielectric constant
$N$ = doping of body All of the above constants for the threshold voltage $V_T$ are process dependent, except for the back bias voltage of the body with respective source $V_{BG}$. From the above equations, it can be seen that once the gate to source voltage and the drain to source voltages are determined by the MOS switch use, the only variable which can effect the overall value of RON is the back bias voltage of the body with respect to the source.

For the dielectrically isolated switch of the present invention, the voltage of the body equals the voltage of the source in the steady state condition, that is, when the analog input voltage equals the analog output voltage. During transient conditions, the voltage of the body is within one forward diode drop of the voltage of the source and thus the variation of the "on" resistance of the analog switch of the present invention is limited by the diodes.

In junction isolated devices of the prior art, the bodies of the P channel devices are connected to the most positive voltage source and the bodies of the N channel MOS devices are connected to the most negative voltage source. Thus, the voltage of the body with respect to the source varies as the analog input varies.

Noting that RON is the parallel combination of the P channel MOS device resistance and the N channel MOS device resistance, that is, RON = (RP) (RN)/(RP + RN), and for example, that the body of the P channel and N channel devices are connected to ±12 volts and that the control voltage applied to the gate of the P and N channel devices are ±10 volts, the following calculated table was obtained:

| VIN, VOUT | J.I. RON | D.I. RON |
|---|---|---|
| +5 | 330 | 250 |
| 0 | 363 | 250 |
| −5 | 333 | 250 |

As can be seen from the above table, the junction isolated "on" resistance is at least 80 ohms higher (or 32 percent) than the dielectrically isolated "on" resistance. Also, in the steady state condition, the dielectrically isolated switch has a uniform "on" resistance, whereas the junction isolated switch's "on" resistance varies. Thus, the analog switch of the present invention provides a low uniform "on" resistance and thus does not modulate or produce variations in the analog signal between the input and output.

The designation of elements 20 and 26 as sources and 22 and 24 as drains of MOS devices 16 and 18, respectively, is for convenience of identification and is not meant to be limiting since this designation may be reversed.

What is claimed is:

1. A CMOS switch having an input terminal and an output terminal, comprising:

a P channel metal oxide semiconductor device having a body, a source, a drain and a gate;

a complementary N channel metal oxide semiconductor device having a body, a source, a drain and a gate, said devices connected in parallel between the input terminal and output terminal of said switch through the respective source-drain paths of said devices, to be rendered simultaneously conductive and simultaneously non-conductive upon application of appropriate gating signals to the respective gates of said devices and thereupon permit the passage and block the passage, respectively, of signals between said input and output terminals; and means coupled to the bodies of said devices for connecting said bodies of said devices to a common point of electrical potential when said switch is rendered conductive and disconnecting said bodies of said devices from said common point of electrical potential when said switch is rendered non-conductive.

2. A CMOS switch as in claim 1 including a diode between said source and said body of each said devices whereby said body is limited to one forward diode drop of said source when said switch is rendered conductive.

3. A CMOS switch as in claim 2 including a diode between said drain and said body of each of said devices.

4. A CMOS switch as in claim 3 wherein said means includes a first switching means controlled by said gating signal for providing a conduction path between said bodies of said complementary devices.

5. A CMOS switch as in claim 3 wherein said means includes second switching means controlled by said gating signals for back biasing said bodies of said complementary devices with respect to their sources.

6. A CMOS switch having an input terminal and an output terminal comprising:

a pair of complementary metal oxide semiconductor devices dielectrically isolated having gates and bodies and being connected in parallel between said input and output terminals by their sources and drains; and a first means connected to said pair's bodies for providing a conduction path between said bodies in response to appropriate gating signals applied to said first means and for limiting the maximum voltage between said source and said bodies of said pair.

7. A CMOS switch as in claim 6 wherein said maximum voltage is limited to a forward diode drop of a body to source diode inherent in a metal oxide semiconductor device.

8. A CMOS switch as in claim 7 including a second means connected to said pair's bodies for back biasing said pair's bodies with respect to said pair's sources in response to appropriate nongating signals applied to said pair's gates.

9. A CMOS switch as in claim 8 wherein said first means includes two N channel MOS devices having their sources and drains connected in series between said pair's bodies.

10. A CMOS switch as in claim 9 wherein said second means includes a p channel MOS device having its source and drain connected between a positive voltage source and said body of said pair's P channel MOS device; and two N channel MOS devices having their sources and drains connected in series between a negative voltage source and said body of said pair's N channel MOS device.

* * * * *